(12) United States Patent
Ohki

(10) Patent No.: US 7,423,285 B2
(45) Date of Patent: Sep. 9, 2008

(54) WIRE CROSS-POINT FET STRUCTURE

(75) Inventor: Hiroshi Ohki, Tokyo (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/328,163

(22) Filed: Jan. 10, 2006

(65) Prior Publication Data

US 2006/0175638 A1 Aug. 10, 2006

(30) Foreign Application Priority Data

Jan. 14, 2005 (JP) ............................. 2005-008112

(51) Int. Cl.
*H01L 29/08* (2006.01)
(52) U.S. Cl. .................. 257/41; 257/211; 257/E21.404; 257/E29.07; 977/767; 977/938
(58) Field of Classification Search ........................ None
See application file for complete search history.

(56) References Cited

U.S. PATENT DOCUMENTS

| | | | |
|---|---|---|---|
| 6,559,468 B1 * | 5/2003 | Kuekes et al. .................. 257/14 |
| 2002/0125504 A1 * | 9/2002 | Perlov et al. .................. 257/207 |
| 2002/0179564 A1 * | 12/2002 | Geobegan et al. .............. 216/7 |
| 2005/0045919 A1 * | 3/2005 | Kaeriyama et al. .......... 257/211 |
| 2005/0164583 A1 * | 7/2005 | Geobegan et al. ........... 442/327 |

FOREIGN PATENT DOCUMENTS

| | | |
|---|---|---|
| JP | 2005-197612 A | 7/2005 |
| JP | 2006-32477 A | 2/2006 |

* cited by examiner

*Primary Examiner*—A. Sefer
*Assistant Examiner*—Scott R Wilson
(74) *Attorney, Agent, or Firm*—Nixon & Vanderhye P.C.

(57) ABSTRACT

The difficulty of miniaturization of large-scale integrated circuits in electric devices based on the conventional techniques involving three-dimensional device structures or the introduction of novel materials is solved. Wires 2 and 3 are disposed to intersect one another in midair in a matrix. The ends of the wires 2 and 3 in midair are designed to be in direct contact with the insides of a package which contains a semiconductor device so that electrical connection and/or physical support can be acquired. Cross point 1 where wires 2 and 3 are in contact with each other is a region which has current switching function similar to the function of a channel of a common MOSFET. Cross point 1 is a region where base wire 2 functioning as a substrate and gate electrode wire 3 functioning as a control electrode (gate electrode) intersect in contact with one another, or a region where base wire 2 and a lead wire 4 overlap. The diameter and length of the wires as well as the distance therebetween can be designed as desired based on desired device specifications. The semiconductor device is insulated by gas (which is sealed with resin e.g. as the case may be) or vacuum except for an isolation region formed in base wire 2.

13 Claims, 7 Drawing Sheets

WIRE CROSS-POINT FET STRUCTURE

BACKGROUND OF THE INVENTION

1. Field of the Invention

The present invention relates to a semiconductor device and a method for manufacturing the same, in particular, it is an object of the invention to provide a semiconductor device suitable for large scale integration and capable of reconfiguring its circuit structure. Another object of the invention is to provide a method for manufacturing semiconductor devices in a self-organizing manner.

2. Background Art

Ever higher levels of integration have been actively pursued in large-scale integrated circuits (LSIs) by miniaturization and structural improvements or the like based on the guiding principle of scaling rule. Examples of known technologies include capacitors with a three-dimensional structure (Patent Documents 1 to 3), transistors which read memory information, transistors which write memory information, memory cells (Patent Document 3) in which capacitors are formed in a three-dimensional structure, and semiconductor devices (Patent Document 4) in which semiconductor chips are stacked three-dimensionally.

Generally, the aforementioned semiconductor devices are manufactured by a process whereby thin films of dielectric material or metallic material are formed on a substrate by thin-film formation technology such as sputtering or CVD (Chemical Vaper Deposition). The thin films are then processed by photolithography technology and etching technology.

Meanwhile, recent remarkable advances in semiconductor technology have made it possible to develop large-scale ASICs called systems-on-chip. However, the larger the semiconductor device becomes, the greater the time and cost for the production will become. Conventionally, for a functional prototype production, general-purpose ICs are arranged on a substrate, and wiring is conducted manually to construct a circuit. In another method, a plurality of substrates are connected or added to a predetermined standard path.

Patent Document 1: JP Patent Publication (Kokai) No. 8-139293 A (1996)

Patent Document 2: JP Patent Publication (Kokai) No. 10-22471 A (1998)

Patent Document 3: JP Patent Publication (Kokai) No. 10-56148 A (1998)

Patent Document 4: JP Patent Publication (Kokai) No. 2000-260934 A

DISCLOSURE OF THE INVENTION

Although conventional semiconductor devices employ three-dimensional device structures, they are after all produced by stacking two-dimensionally processed layers on a substrate. Therefore, there is a limit in higher integration. Even if a new material is introduced for maintaining the trend toward higher integration, the present methods, by which thin films are made out of materials by sputtering or CVD (Chemical Vaper Deposition) and then processed by photorethography and etching, cannot solve the conventional problems fundamentally.

Moreover, with the conventional method whereby a desired circuit is constructed by providing general-purpose integrated circuits on a substrate and manually wiring them for a functional prototype production, there is a problem in that time and cost for the circuit design become huge when it is necessary to modify or add functions, which would require newly designing a large-scale integrated circuit.

This invention provides a semiconductor device capable of large-scale integration and circuit reconfigurations. Another object of the invention is to provide a method for manufacturing a semiconductor device that can be manufactured in a self-organizing manner.

The semiconductor device according to the invention is characterized in that it is formed by a matrix structure which is not supported on the substrate. With this, integration circuits can be structured without depending on the conventional production methods. The matrix structure of this invention is preferably structured by wires so that higher levels of integration can be achieved three-dimensionally.

For example, the semiconductor device of this invention has a three-dimensional meshed structure in which wires are used as basic elements. Wires are in contact with each other at their peripheries as they cross, making it possible at the points of intersection to control the conductance of the carriers which move through wires. Furthermore, the semiconductor device of the invention can be of a stacked structure comprised of semiconductor devices formed in two-dimensional planes electrically coupled to one another by three-dimensional wiring.

Wires as a basic unit of this invention are preferably silicon- or carbon-based wires for achieving very fine sizes.

The semiconductor devices of the invention provides a matrix structure capable of forming a programmable logic circuit for allowing circuit restructuring.

The method for manufacturing a semiconductor device according to the invention preferably comprises forming a matrix structure in a self-organizing manner, in order to prevent the fine structure formation from being limited by the processing method.

According to this invention, unit chips are formed by disposing wires in a matrix without being supported by a substrate, and then the unit chips are arranged or stacked spatially. In this way, the unit chips with various functions can be merged, making it possible to provide semiconductor devices which have been highly improved in device function and level of integration. In addition, the invention gives more freedom to unit chip arrangement.

DESCRIPTION OF PREFERRED EMBODIMENTS OF THE INVENTION

Figure 1:
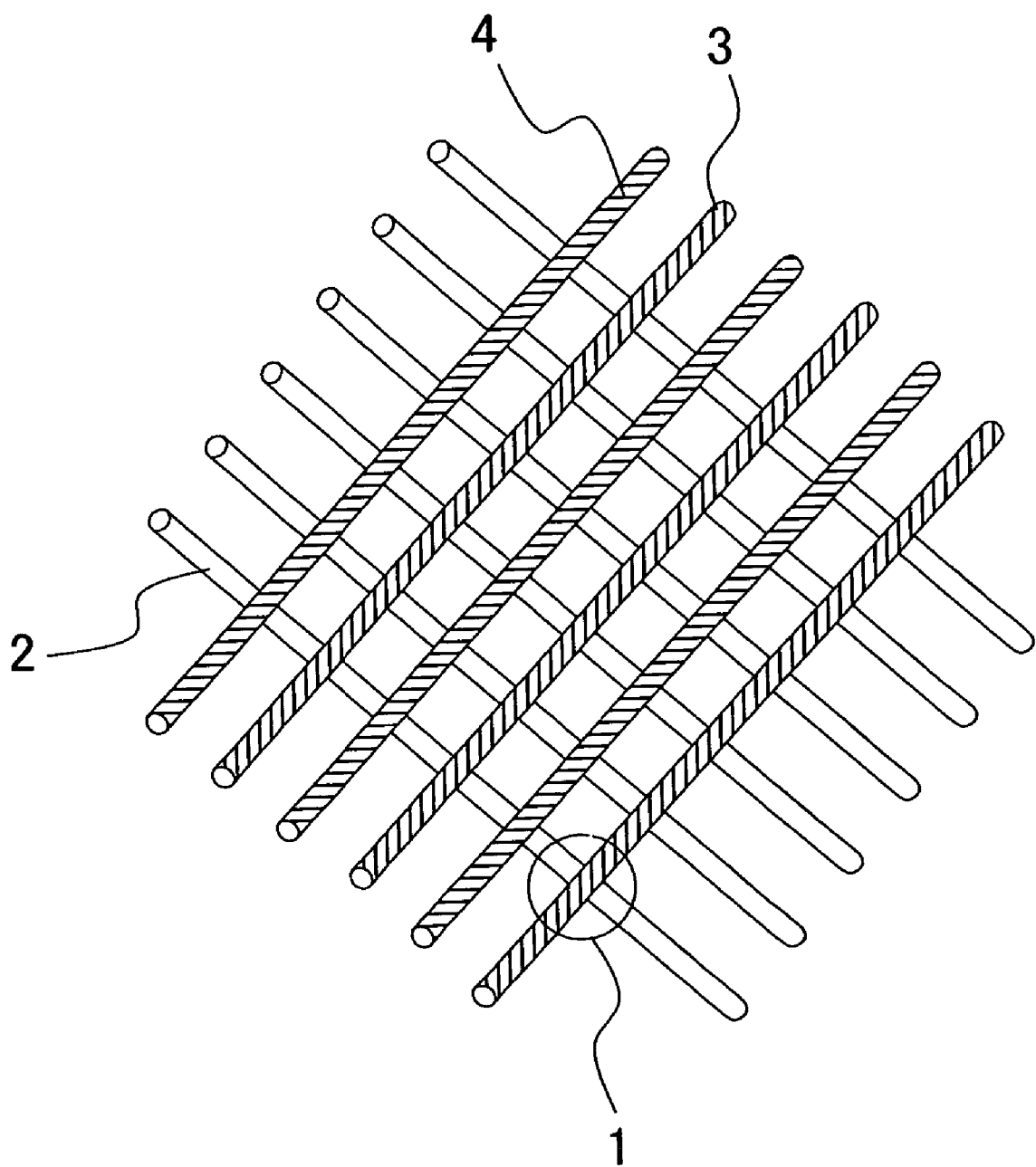
FIG. 1 shows a schematic diagram of a semiconductor device according to a first embodiment of the invention.

A semiconductor device according to a first embodiment of the invention is described with reference to the drawings. FIG. 1 shows a schematic structure of a semiconductor device according to the invention. As shown in FIG. 1, unlike conventional silicon semiconductor devices, the semiconductor device of the embodiment is not formed on an underlayer substrate such as a silicon substrate. Specifically, as shown in FIG. 1, in the semiconductor device of the embodiment, wires 2 and wires 3 intersect one another in a matrix in midair. As will be described later, the wires 2 and wires 3 in midair are designed to provide electrical connection and/or physical support when their ends directly abut against the inside of a package which contains the semiconductor device.

A intersection point 1 where wire 2 and wire 3 intersect in contact with each other is a region which has a current-switching function similar to the function of a channel in a common MOSFET (Metal-Oxide-Semiconductor-Field Effect Transistor). The intersection point 1 is a region where a base wire 2 functioning as a substrate and a gate electrode wire 3 functioning as a control electrode (gate electrode) intersect in contact with each other, or where a base wire 2 and a lead wire 4 overlap. The diameter and length of the wires as well as the distance therebetween may be designed as required based on desired device specifications. The semiconductor device of the embodiment is also characterized in that the device is insulated by gas (which is sealed by resin or the like as the case may be) or vacuum except an isolation region formed in base wires 2.

Figure 2:
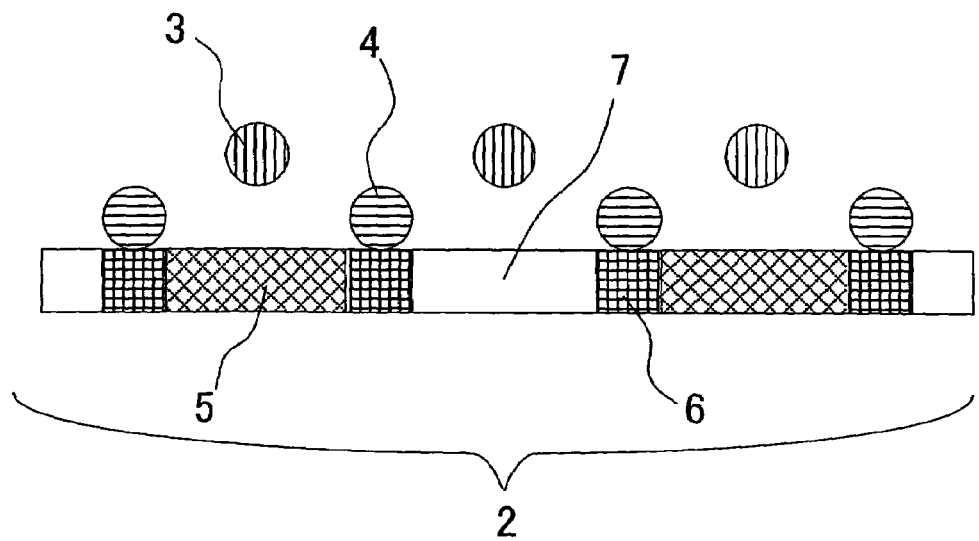
FIG. 2 shows a cross section of the semiconductor device according to the embodiment of the invention.

FIG. 2 is a cross section of the semiconductor device of the embodiment taken along the direction in which the base wire 2 extends. As shown in FIG. 2, a base wire 2 of the embodiment includes channel regions 5, diffusion regions 6, and an element isolation region 7. A gate electrode wire 3 is disposed above a channel region 5 so that insulation is maintained between the channel region 5 and the gate electrode wire 3 by a gap formed therebetween. This gap is preferably filled with vacuum for greater insulation. An interconnection wire 4 is in contact with a diffusion region 6 such that an ohmic junction is formed. If the number of interconnection needs to be increased, it is preferable to arrange interconnection wires such that they are separated spatially at intersecting points.

Figure 3:
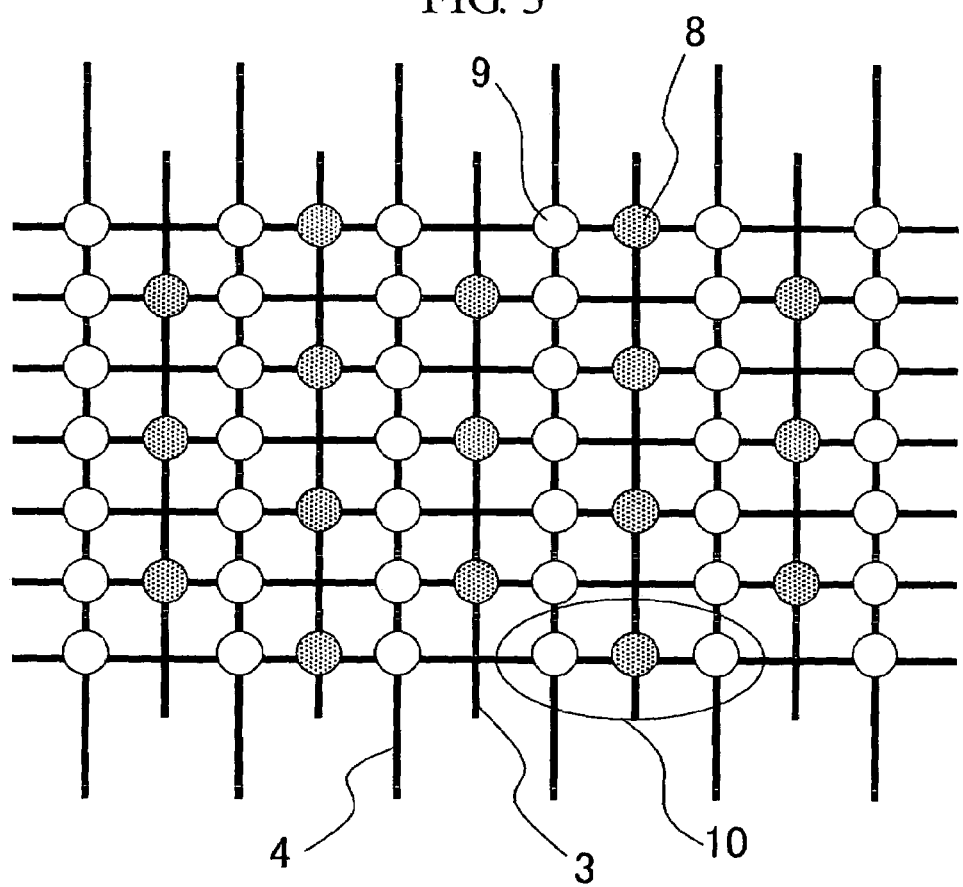
FIG. 3 shows a top view of the semiconductor device according to the embodiment of the invention.

FIG. 3 shows a top view of the embodiment of a semiconductor device. In FIG. 3, gate electrode wires 3 and interconnection wires 4 extend in one direction (from top to bottom in vis versa normal to the plane of the drawing sheet), while base wires 2 extend in another direction (horizontal direction). A switching point 8 between a base wire 2 and a gate electrode wire 3 is a region where signals based on the carriers moving through a base wire 2 are turned on and off. A contact point 9 between a base wire 2 and an interconnection wire 4 is a region where signals are input and output. For example, a single switching unit 10 is comprised of a combination of a single switching point 8 and two contact points 9 disposed on both sides of the switching point 8.

A switching unit 10 is insulated in a vertical direction and in a horizontal direction in FIG. 3 by the isolation region of base wire 2 and the gap between the wires. An integrated circuit can be constructed with these switching units 10 and interconnection wires 4 which are provided in another space. In addition, hardware structure can be altered with the circuit information read in by applying reconfiguration technology such as FPGA (Field Programmable Gate Array) to this structure.

Figure 4:
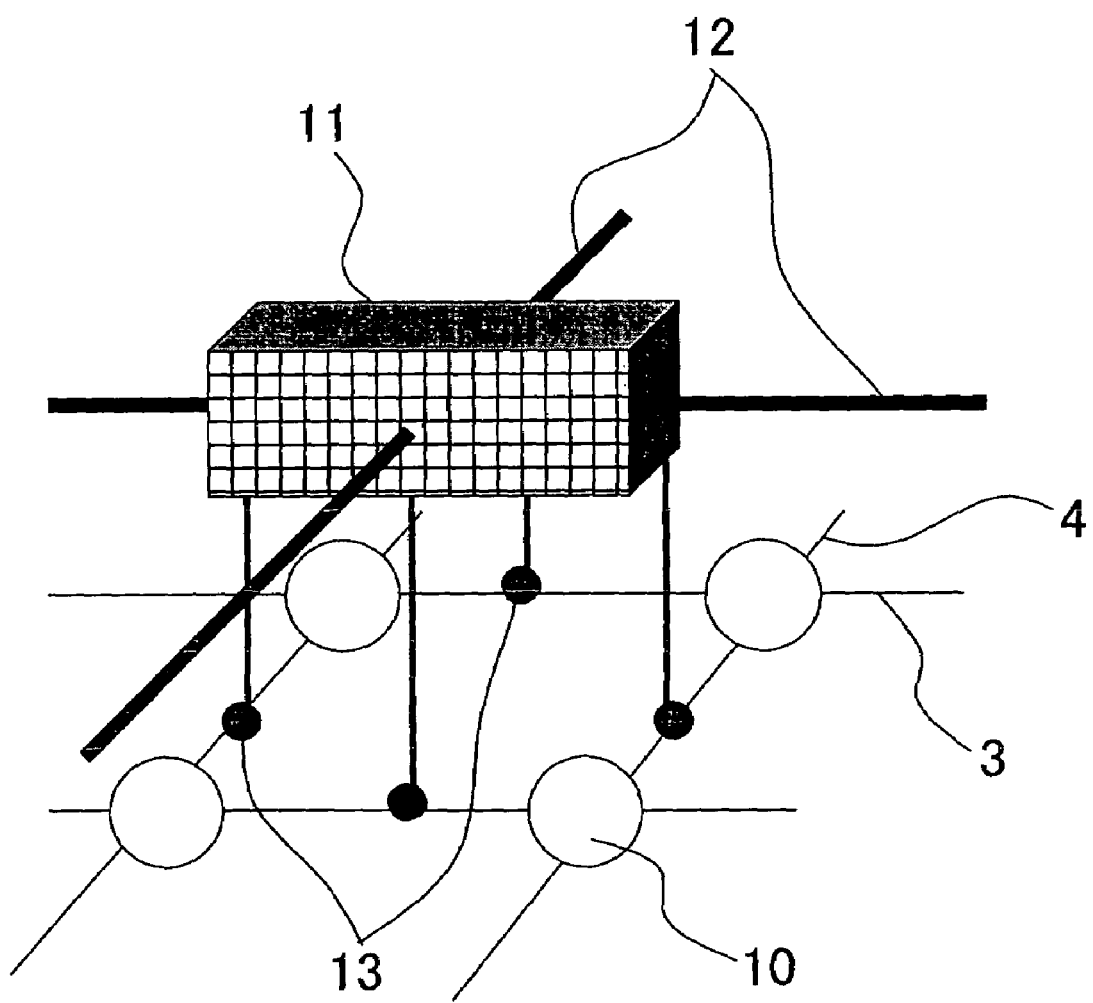
FIG. 4 is a diagram which shows an example of a reconfigurable circuit according to the embodiment of the invention.

FIG. 4 shows an example of a reconfigurable circuit. A reconfigurable logic circuit 11, reconfigurable input interconnection 12 around it, and reconfigurable output interconnection 13 are provided for a gate electrode wire 3 and a interconnection wire 4, which are connected to the switching unit 10 as described in FIG. 3. The logic circuit 11 has its logic defined by data from each its own reconfiguration memory (not shown in the figure). For signals inputted via input interconnection 12 logic operation such as INV, AND, OR, NAND, NOR, or XOR is composed. Thereafter, the results of the operation are output via output lines 13.

That is, any logic circuit can be constructed with the logic circuit 11. The logic circuit 11 may employ a pass transistor comprised of an n-type wire MOS transistor, a wire CMOS pass transistor consisting of a parallel connection of n-type and p-type wire MOS transistors, or a SRAM-type wire memory comprised of n-type and p-type wire MOS transistors. The logic circuit 11 is not limited to a circuit involving a pass transistor but may employ any circuit in which elements with switching functions are used.

In accordance with the semiconductor device of the embodiment, because the switching units 10 can be arranged in a simple matrix, a highly flexible circuit structure can be easily mapped. Furthermore, because nano-size wires are disposed three-dimensionally, a large-scale and highly functional circuits can be easily structured.

Figure 5:
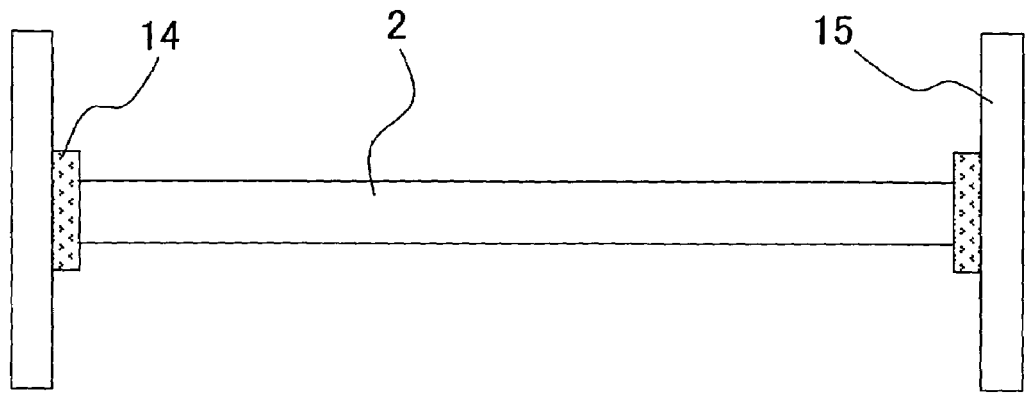
FIG. 5(a), FIG. 5(b), FIG. 6(a), and FIG. 6(b) are cross sectional views of a manufacturing process of a semiconductor device according to an embodiment of the invention.
Figure 5:
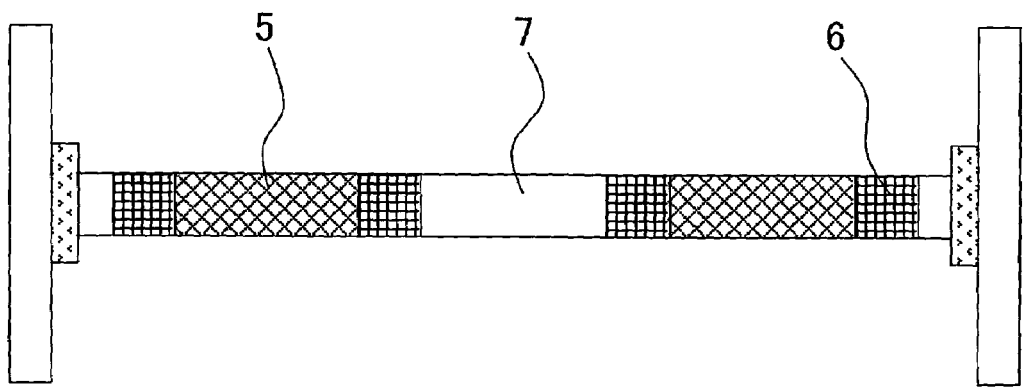
Figure 6:
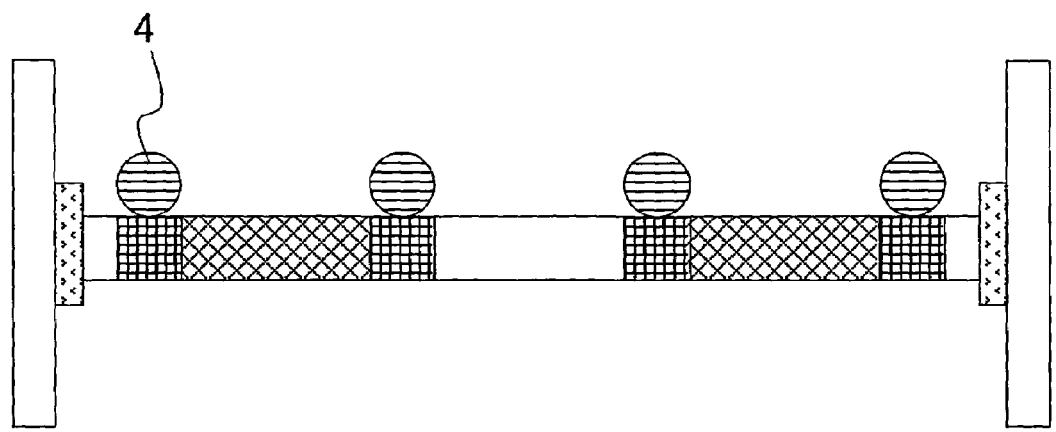
Figure 6:
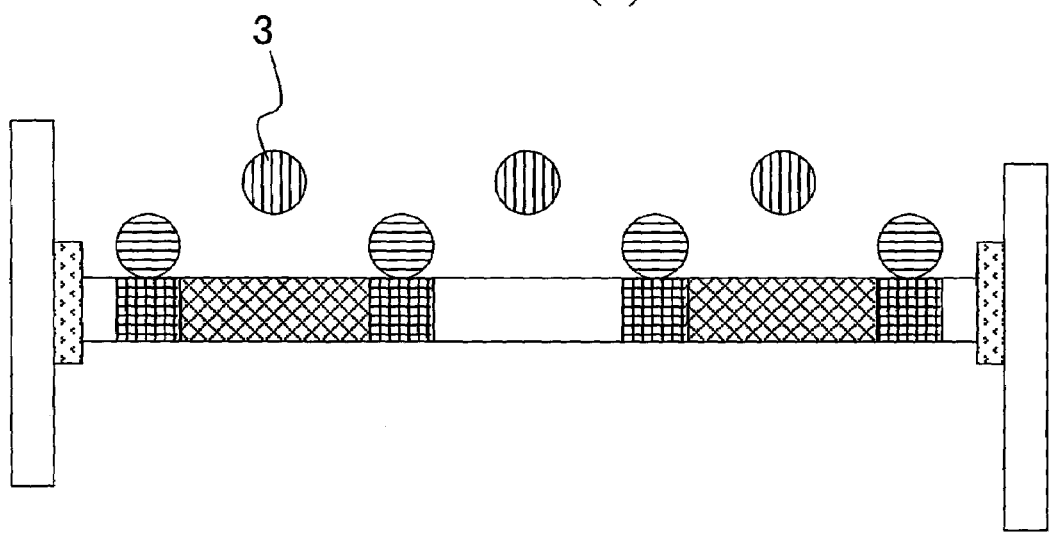

Next, with reference to FIGS. 5 and 6, the main points of a method for manufacturing a semiconductor device according to the present embodiment is described. FIGS. 5 and 6 show cross sections for illustrating the steps of manufacturing a semiconductor device according to the embodiment. As shown in FIGS. 5 and 6, the semiconductor device manufacturing method has a feature in that wires as components of the semiconductor device are directly assembled on a substrate, which is a package for mounting the semiconductor device. The following drawings show only a pair of opposite side faces among the wall surfaces forming the package.

As shown in FIG. 5(a), a substance as a catalyst for growing wires, such as a thin film catalyst layer 14, for example, is formed on the inside of the package 15. This catalyst layer 14 is preferably a highly conductive substance. For example, when silicon wires are used, gold is preferable as the catalyst layer 14. When carbon nanotube is used as wires, nickel, iron, or cobalt is preferable as the catalyst layer 14. Such catalyst layer 14 is disposed at a desired position of the package 15 in accordance with a particular device design policy. Thereafter, with a film production technology such as CVD (Chemical Vaper Deposition), a base wire 2 is formed between the opposite inner surfaces of the package according to optimized wire growth conditions.

As shown in FIG. 5(b), channels 5, diffusion layers 6, and an isolation 7 are formed in the base wire 2 formed in the package 15. Specifically, channels 5 and diffusion regions 6 can be formed by impurity doping using ion implantation involving a beam with a sufficiently reduced diameter, or by producing films with CVD method involving gas containing boron (B) or phosphorus (P) or the like. For the isolation region 7, it is preferable to use an insulation method such that undesired regions are masked and oxygen plasma treatment is implemented.

As shown in FIG. 6(a), interconnection wires 4 are formed in a direction intersecting base wires 2. Interconnection wires 4 can be formed by growing wires with CVD method, starting from catalyst layers 14 formed on the opposite side faces of the package different from the package shown. Base wires 2 and interconnection wires 4 can be brought into contact with each other by applying voltage between base wires 2 and interconnection wires 4 so as to heat them (anodic bonding).

As shown in FIG. 6(*b*), gate electrode wires 3 are formed to extend in a direction intersecting base wires 2. Gate electrode wires 3 can be formed by using catalyst layers 14 and CVD method, in the same way for base wires 2 and lead wires 4.

In order to form multilayer wiring, wires can be grown by using CVD method with catalyst layers disposed at a desired position of gate electrodes 3 and lead wires 4. The growth direction of the wires is preferably perpendicular to base wires 2, gate electrode wires 3, and interconnection wires 4. These vertically grown wires can be connected to base wires 2, gate electrode wires 3, and interconnection wires 4 via interconnection wires which are in the horizontal direction. A desired multilayer wiring structure can be formed by repeating such process with the help of precise control technology such as self-organizing technology.

As explained above, N-type and p-type switching units 10 (FIG. 3) can be formed, and they have been each confirmed to exhibit transistor characteristics. Furthermore, when a large-scale integration circuit (LSI) was manufactured using a circuit test pattern, a basic device operation was observed.

A semiconductor device manufacturing technology according to the second embodiment of the invention is described with reference to the drawings. The embodiment provides a semiconductor device which has enhanced functions (multiple functions) by stacking semiconductor devices.

Figure 7:
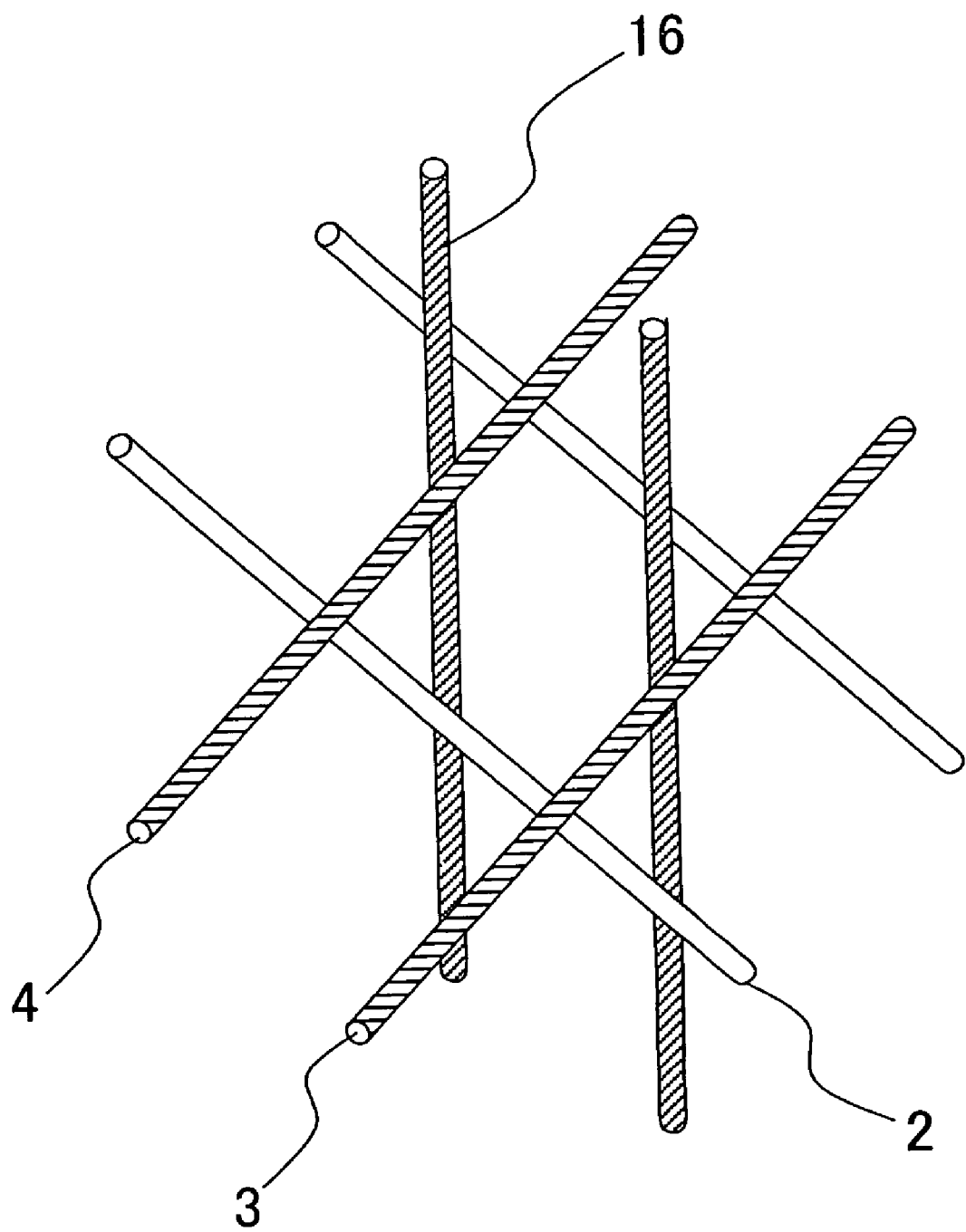
FIG. 7 is a perspective view of a semiconductor device according to a second embodiment of the invention.

FIG. 7 is a perspective view of an example structure of a semiconductor device according to the present embodiment. In a base wire 2, channel regions, diffusion regions and isolation regions are formed (not shown) in the same way as in the first embodiment. In the proximity of channel regions of the base wire 2, a gate electrode wire 3 is arranged orthogonal to the base one. An interconnection wire 4 is arranged parallel to the gate electrode wire 3. Chip-to-chip wires 16 are arranged in a direction orthogonal to both the gate electrode 3 and the interconnection wire 4. That is, the semiconductor device according to the present embodiment has a three-dimensional structure wherein any base wire 2, any one of gate electrode wire 3 and interconnection wire 4, and any chip-to-chip wire 16 are orthogonal to one another. The ends of the base wire 2, the gate electrode wire 3, the interconnection wire 4, and the chip-to-chip wire 16 are, as shown in FIGS. 5 and 6, electrically connected to a package and can exchange signals with the outside. Not all of the wire ends need to be connected to the package surfaces.

Figure 8:
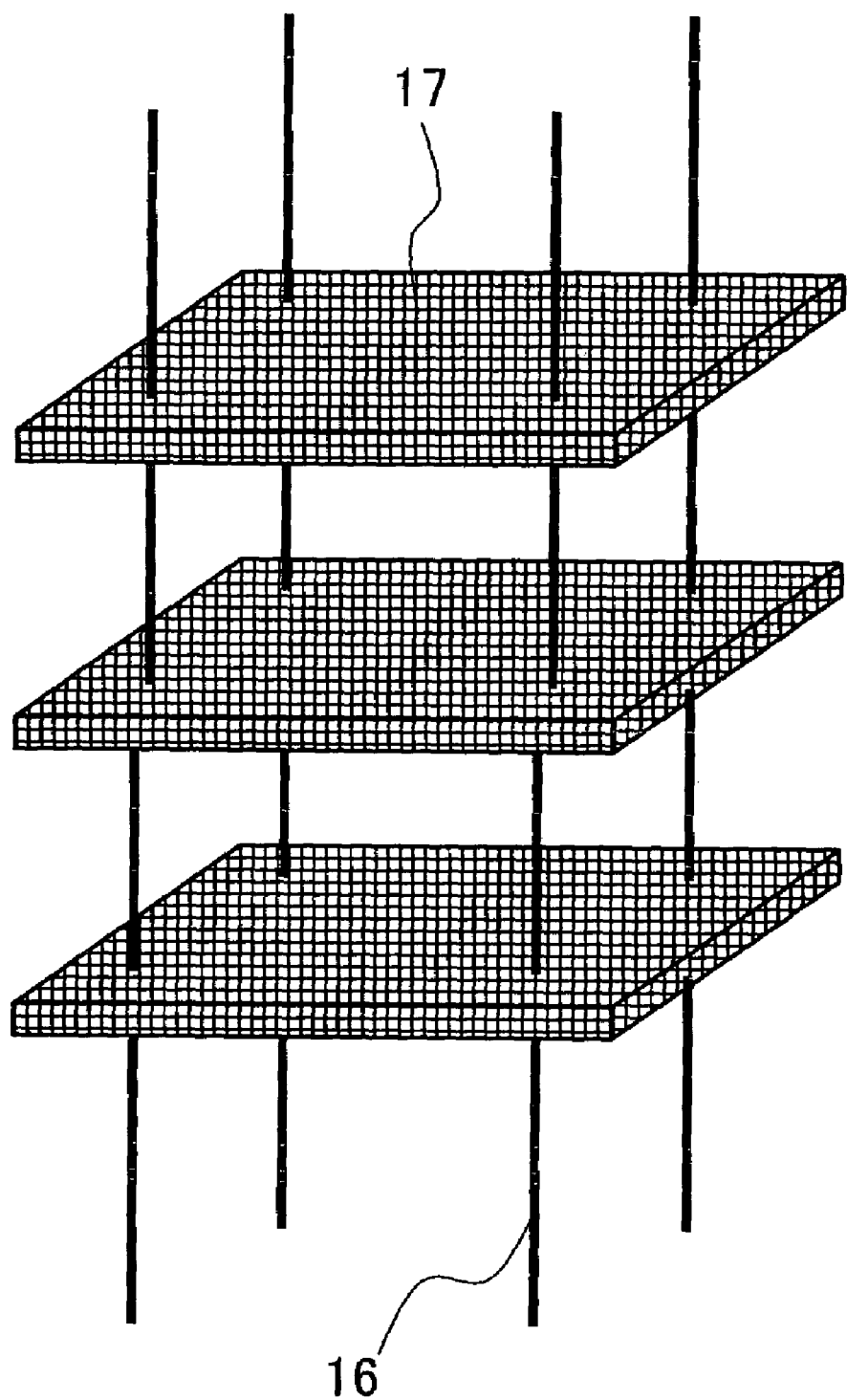
FIG. 8 is a schematic diagram of an overall structure of a stacked semiconductor device according to the embodiment of the invention.

FIG. 8 shows an example of the overall structure of the stacked semiconductor device according to the embodiment. As shown in FIG. 8, unit chips 17 comprising base wires 2, gate electrode wires 3 and interconnection wires 4 are connected to one another via chip-to-chip wires 16. In the illustrated example, unit chips 17 are stacked. It is possible to combine unit chips having various functions by arranging or stacking these unit chips 17 spatially. Therefore, it is possible to provide semiconductor devices whose element functions and levels of integration are highly enhanced. There is another advantage that the unit chips can be arranged more freely.

INDUSTRIAL APPLICABILITY

The invention can be utilized as a technology for forming integrated circuit by integrating wires.

What is claimed is:

1. A semiconductor integrated circuit comprising:
   a plurality of semiconductor devices each comprising a matrix comprising a first wire which extends in a first direction and a second wire which extends in a second direction that is different from said first direction;
   a wire that three-dimensionally connects the plurality of the semiconductor devices, and wherein the first and second wires are each supported in a spaced apart manner so that in at least one of the semiconductor devices the first and second wires cross each other in mid-air in a gas-filled and/or vacuum area.

2. The semiconductor integrated circuit according to claim 1, wherein at least one of said first wire or said second wire is supported at its ends.

3. The semiconductor integrated circuit according to claim 2, wherein said supporting portion is an inner wall of a carrier which contains the semiconductor device.

4. The semiconductor integrated circuit according to claim 1, wherein in at least one of the semiconductor devices a switching unit is formed at a point of intersection of said first and second wire, wherein said switching unit controls the conductance of a carrier that move in at least said first or second wire.

5. A semiconductor integrated circuit comprising:
   the switching unit described in claim 4;
   a gate electrode wire and an interconnection wire connected to said switching unit;
   a reconfigurable logic circuit connected to said gate electrode wire and said interconnection wire for providing predetermined signals to each thereof wherein the logic of said logic circuit is determined by data in a respectively corresponding reconfiguration memory.

6. The semiconductor integrated circuit according to claim 1, further comprising in each of the semiconductor devices a lead wire disposed in a third direction different from said first and/or second directions, wherein said lead wire is connected to at least one of said first wire or second wire.

7. The semiconductor integrated circuit according to claim 1, wherein said semiconductor devices form a three-dimensional stacked structure.

8. The semiconductor integrated circuit according to claim 1, wherein said wires are formed with silicon or carbon.

9. The semiconductor integrated circuit according to claim 1, wherein said matrix structure constitutes a programmable logic circuit.

10. The semiconductor integrated circuit of claim 1, wherein first contacts of the first and second wires form sources and drains of semiconductor devices, and second contacts of the first and second wires form gate electrodes of semiconductor devices.

11. A semiconductor integrated circuit comprising:
    a plurality of semiconductor devices each comprising a matrix comprising a first wire which extends in a first direction and a second wire which extends in a second direction that is different from said first direction;
    wherein first cross-points of the first and second wires which contact each other form semiconductor devices, and second cross-points of the first and second wires which do not contact each other form isolation of wires for semiconductor devices; and
    wherein the first and second wires cross each other in mid-air in a gas-filled and/or vacuum area.

12. A method for manufacturing a semiconductor integrated circuit according to claim 1, wherein said matrix structure is formed in a self-organizing manner, the method comprising:

disposing a substance at a catalyst for growing wires on the inside of a package in accordance with a particular device design, and forming a base wire between the opposite inner surface of the package according to optimized wire growth conditions;

forming a diffusion layer, and isolation in the base wire;

forming an interconnection wire in a direction intersecting the base wire starting from the catalyst layer formed on the opposite side faces of the package different from the package;

forming a source and drain electrode to contact the diffusion layer, and forming a gate electrode not contacting the base wire, in mid-air in a gas-filled and/or vacuum area;

disposing catalyst layer at a desired position of the gate wire in order to form multilayer wiring, wherein the growth direction of the multilayer wiring crosses the base wire, the gate electrode wire and interconnection wire and connect the multilayer wiring to the base wire, the gate electrode wire and interconnection wire.

13. The semiconductor integrated circuit of any of claims 1, 10 and 11, wherein the semiconductor devices form three-dimensional layer-by-layer structure to a spaced apart direction or non contact direction.

* * * * *